US009377998B2

(12) United States Patent
Han et al.

(10) Patent No.: US 9,377,998 B2
(45) Date of Patent: Jun. 28, 2016

(54) CODE GENERATION FOR CONTROL DESIGN

(71) Applicant: The MathWorks, Inc., Natick, MA (US)

(72) Inventors: Zhi Han, Acton, MA (US); Fu Zhang, Sherborn, MA (US); Murali K. Yeddanapudi, Watertown, MA (US); Pieter J. Mosterman, Framingham, MA (US)

(73) Assignee: The MathWorks, Inc., Natick, MA (US)

( * ) Notice: Subject to any disclaimer, the term of this patent is extended or adjusted under 35 U.S.C. 154(b) by 603 days.

(21) Appl. No.: 13/803,026

(22) Filed: Mar. 14, 2013

(65) Prior Publication Data

US 2013/0198713 A1    Aug. 1, 2013

Related U.S. Application Data

(63) Continuation-in-part of application No. 13/291,899, filed on Nov. 8, 2011, now Pat. No. 8,914,262, and a continuation-in-part of application No. 13/291,907, filed on Nov. 8, 2011, now Pat. No. 8,935,137.

(51) Int. Cl.
G06F 17/50 (2006.01)
G06F 9/44 (2006.01)
G06F 17/13 (2006.01)
G06F 9/455 (2006.01)

(52) U.S. Cl.
CPC .. *G06F 8/30* (2013.01); *G06F 8/10* (2013.01); *G06F 8/35* (2013.01); *G06F 17/13* (2013.01); *G06F 17/5009* (2013.01)

(58) Field of Classification Search
USPC ............... 703/2, 6, 11, 13; 706/12; 711/162; 718/100
See application file for complete search history.

(56) References Cited

U.S. PATENT DOCUMENTS

| 6,226,789 | B1 | 5/2001 | Tye et al. | |
|---|---|---|---|---|
| 7,904,280 | B2 * | 3/2011 | Wood | G06F 17/5009 700/2 |
| 8,156,147 | B1 | 4/2012 | Tocci et al. | |
| 8,914,262 | B2 * | 12/2014 | Zhang | G06F 8/10 703/13 |

(Continued)

OTHER PUBLICATIONS

Bang Jensen et al., "Digraphs Theory, Algorithms and Applications", Aug. 2007, 772 pages.

(Continued)

*Primary Examiner* — Thai Phan
(74) *Attorney, Agent, or Firm* — Harrity & Harrity, LLP

(57) ABSTRACT

A method, performed by a computer device, includes obtaining an in-memory representation of computer code from a block step method of an executable model in a modeling application, wherein the computer code in-memory representation includes one or more variables. The method also includes identifying, from the one or more variables, a subset of persistent variables and determining if any of the one or more variables in the subset of persistent variables are state variables. When none of the subset of persistent variables are state variables, a block output method is generated based on the computer code in-memory representation and the one or more variables. When the subset of persistent variables includes a state variable, both the block output method and a block update method are generated based on the computer code in-memory representation and the one or more variables.

30 Claims, 10 Drawing Sheets

(56) References Cited

U.S. PATENT DOCUMENTS

| | | | |
|---|---|---|---|
| 8,935,137 B1* | 1/2015 | Han | G06G 7/48 703/6 |
| 2007/0043992 A1* | 2/2007 | Stevenson | G06F 8/20 714/732 |
| 2007/0083347 A1* | 4/2007 | Bollobas | G06F 17/10 703/2 |
| 2007/0157162 A1 | 7/2007 | Ciolfi | |
| 2008/0059739 A1* | 3/2008 | Ciolfi | G06F 17/5009 711/162 |
| 2009/0012754 A1 | 1/2009 | Mosterman et al. | |
| 2009/0228250 A1* | 9/2009 | Phillips | G06F 17/5031 703/2 |
| 2009/0235252 A1* | 9/2009 | Weber | G06F 8/10 718/100 |
| 2010/0017179 A1* | 1/2010 | Wasynczuk | G05B 17/02 703/6 |
| 2010/0057651 A1* | 3/2010 | Fung | G06N 7/005 706/12 |
| 2010/0228693 A1 | 9/2010 | Dawson et al. | |
| 2010/0262568 A1 | 10/2010 | Schwaighofer et al. | |
| 2011/0137632 A1 | 6/2011 | Paxson et al. | |
| 2012/0023477 A1 | 1/2012 | Stevenson et al. | |
| 2013/0116986 A1 | 5/2013 | Zhang et al. | |
| 2013/0116987 A1 | 5/2013 | Zhang et al. | |
| 2013/0116988 A1 | 5/2013 | Zhang et al. | |
| 2013/0116989 A1 | 5/2013 | Zhang et al. | |

OTHER PUBLICATIONS

Bauer, "Computational Graphs and Rounding Error", SIAM Journal on Numerical Analysis, vol. 11 No. 1, Mar. 1974, 10 pages.
Griewank, et al., "Evaluating Derivatives: Principles and Techniques of Algorithmic Differentiation", 2008, 458 pages.
Sezer et al., "Nested Epsilon Decompositions of Linear Systems: Weakly Coupled and Overlapping Blocks", Proceedings of the 1990 Bilkent Conference on New Trends in Communication, Control and Signal Processing, vol. 1, (1990), 13 pages.
Zecevic et al., "Control of Complex Systems—Decompositions of Large-Scale Systems", Chapter 1, Communications and Control Engineering, (2010) 27 pages.
Henzinger, "The Theory of Hybrid Automata", Proceedings of the 11$^{th}$ Symposium on Logic in Computer Science (LICS '96) 1996, 30 pages.
Paliwal et al., "State Space Modeling of a Series Compensated Long Distance Transmission System through Graph Theoretic Approach", IEEE, 1978, 10 pages.
Ilic et al., "A Simple Structural Approach to Modeling and Analysis of the Inter-area Dynamics of the Large Electric Power Systems: Part I—Linearized Models of Frequency Dynamics", 1993 North American Power Symposium, Oct. 11-12, 1993, pp. 560-569.
Ilic et al., "A Simple Structural Approach to Modeling and Analysis of the Inter-area Dynamics of the Large Electric Power Systems: Part II—Nonlinear Models of Frequency and Voltage Dynamics", Oct. 11-12, 1993, pp. 570-578.
Hiskens, Ian A. and Pai, M.A. "Trajectory Sensitivity Analysis of Hybrid Systems." IEEE Transactions on Circuits and Systems—Part I: Fundamental Theory and Applications, vol. 47, No. 2, Feb. 2000, pp. 204-220.
Hiskens, Ian A. and Pai, M.A. "Power System Applications of Trajectory Sensitivities." IEEE, 2002, pp. 1-6.
Nguyen, Tony B., Pai, M.A, and Hiskens, I.A. "Computation of Critical Values of Parameters in Power Systems Using Trajectory Sensitivities." 14th PSCC, Sevilla, Jun. 24, 2002, Session 39, Paper 5, pp. 1-6.
Donze, Alexandre and Maler, Oded. "Systematic Simulation using Sensitivity Analysis." Verimag, Gieres, France, pp. 1-16.
Masse, J. "Diffedge: Differentiation, sensitivity analysis and idenfication of hybrid Models." Appedge, Consulting & Engineering, pp. 1-9.
Serban, Radu and Hindmarsh, Alan C. "CVODES: An ODE Solver with Sensitivity Analysis Capabilities." ACM Transactions on Mathematical Software, vol. V, No. N, Sep. 2003, pp. 1-22.
Griewank, Andreas. "A mathematical view of automatic differentiation." Acta Numerica, 2003, pp. 1-78.
Griewank, Andreas and Reese, Shawn. "On the Calculation of Jacobian Matrices by the Markowitz Rule." Mar. 1992, pp. 1-14.
Henzinger, Thomas A. "The Theory of Hybrid Automata." pp. 1-30.
Zecevic, A.I. and Siljak, D.D. "Design of Robust Static Output Feedback for Large-Scale Systems." IEEE Transactions on Automatic Control, vol. 49, No. 11, Nov. 2004, pp. 1-5.
Peponides, George M. and Kokotovic, Petar V. "Weak Connections, Time Scales, and Aggregation of Nonlinear Systems." IEEE Transactions on Automatic Control, vol. AC-28, No. 6, Jun. 1983, pp. 729-735.
Siljak, D.D. "On Stability of Large-Scale Systems under Structural Perturbations." IEEE Transactions on Systems, Man, and Cybernetics, Jul. 1973, pp. 415-417.
Vidyasagar, M. "Decomposition Techniques for Large-Scale Systems with Nonadditive Interactions: Stability and Stabilizability." IEEE Transactions on Automatic Control, vol. AC-25, No. 4, Aug. 1980, pp. 773-779.
International Search Report and Written Opinion dated Jan. 31, 2013 issued in corresponding PCT application No. PCT/US2012/063223, 9 pages.
Co-pending U.S. Appl. No. 13/291,907, entitled "Graphic Theoretic Linearization of Sensitivity Analysis", by Zhang et al., filed Nov. 8, 2011, 64 pages.

* cited by examiner

```
function x = determineState(step)
[stepCFG, m] = createCFG(step);
% Create a modified CFG
[stepCFG, m] = addEntryPoint(stepCFG, m);
firstStmt = succ(stepCFG.entry);
modifiedCFG = addEdge(stepCFG, ...
   edge(stepCFG.exit), firstStmt)
% Analyze liveness
x = []
for x_i = step.x
   p = DefUse.analyzeLive(modifiedCFG, m, x_i);
   if (p.out(stepCFG.out) && p.in(firstStmt))
      x = [x; x_i];
   end
end
end
```

```
800 ─┐
       function step ( )
       persistent x;
       % assume a, b, c, d, are constants
       Global y, u;
       y = c • x + d • u
       x = a • x + b • u
       end
```

FIG. 8

```
                    ─ 900
function output ( )
xt = x;
y = c • xt + d • u
xt = a • xt + b • u
end
```

FIG. 9

```
                              ─ 1000
              function update ( )
              x = a • x + b • u
              end
```

FIG. 10

```
function output_du()
d_u = 1;
d_x = 0;
xt = x;
d_xt = d_x;
d_yj = 0 • xt + c • d_xt + 0 • u + d • d_u;
end function output_dx()
d_x = 1;
d_u = 0;
xt = x;
d_xt = d_x;
d_yj = 0 • xt + c • d_xt + 0 • u + d • d_u;
end
```

FIG. 11

CODE GENERATION FOR CONTROL DESIGN

This patent application is a continuation-in-part of U.S. patent application Ser. No. 13/291,899, entitled "VISUALIZATION OF DATA DEPENDENCY IN GRAPHICAL MODELS" and filed on Nov. 8, 2011, which is hereby incorporated by reference in its entirety. This patent application is also a continuation-in-part of U.S. patent application Ser. No. 13/291,907, entitled "GRAPH THEORETIC LINEARIZATION AND SENSITIVITY ANALYSIS" and filed on Nov. 8, 2011, which is hereby incorporated by reference in its entirety.

BACKGROUND INFORMATION

A large variety of systems, such as mechanical systems, electrical systems, biological systems, and/or computer systems, may be represented as dynamic systems. Computational tools have been developed to model, simulate, and/or analyze dynamic systems. A computational tool may represent a dynamic system as a graphical model. The graphical model may include blocks that may represent components of the dynamic model. The blocks may be connected to represent relationships between the components. The computational tool may simulate the graphical model and may provide results of the simulation for analysis. Before a static analysis of the dynamic model can be performed using existing control design products, code in each of the blocks may require a complete separation of certain functions, such as an output function and an update state function. Rewriting code to separate functions for legacy blocks (e.g., that were not coded with complete separation of these functions) can be labor intensive.

BRIEF DESCRIPTION OF THE DRAWINGS

FIGS. 8-11 illustrate examples of generated code according to implementations described herein.

DETAILED DESCRIPTION OF PREFERRED EMBODIMENTS

Figure 1:
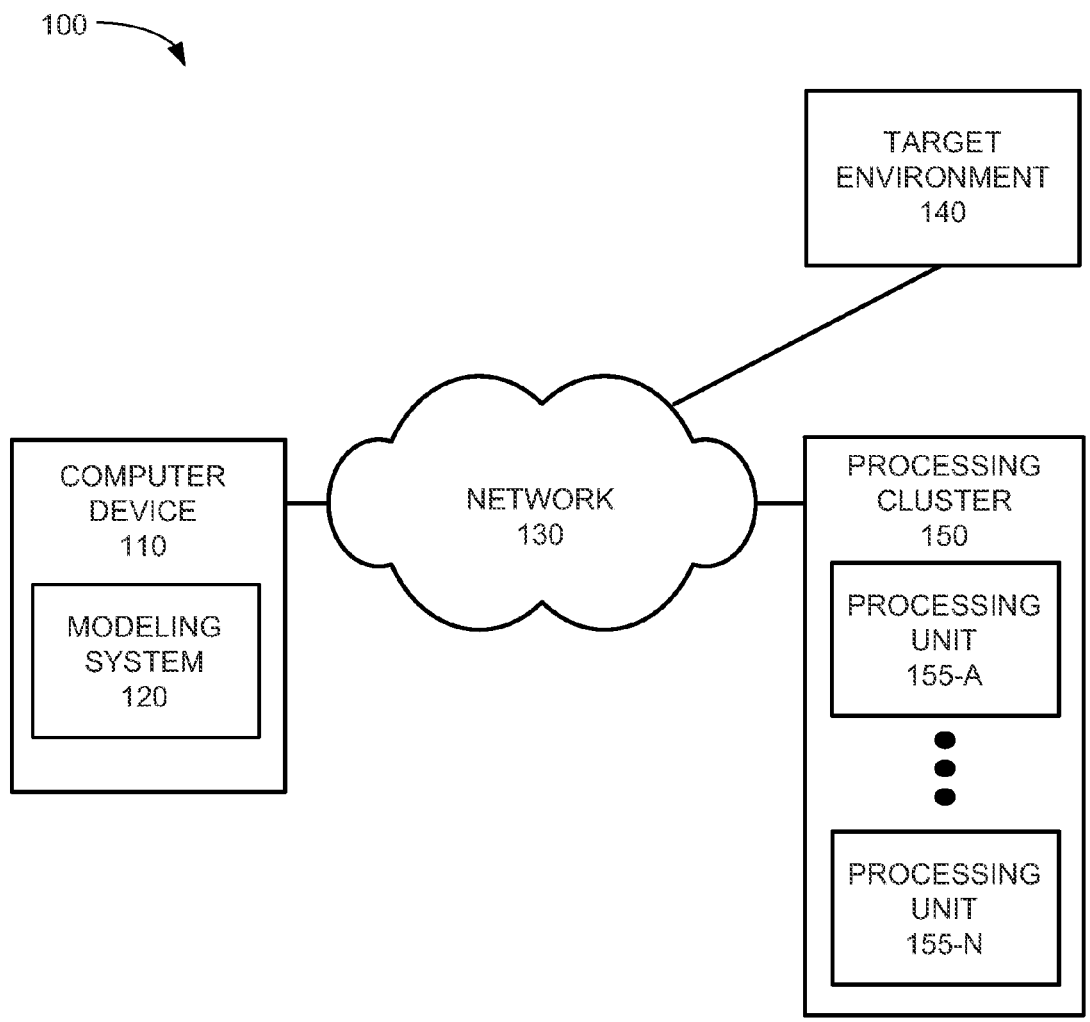
FIG. 1 is a diagram illustrating exemplary components of an environment according to an implementation described herein.

The following detailed description refers to the accompanying drawings. The same reference numbers in different drawings identify the same or similar elements. Also, the following detailed description does not limit the invention.

An implementation described herein relates to automated code generation associated with a graphical model in a modeling application. Particularly, the automatically generated code may convert code modules (referred to herein as blocks) with step functions into code with separate update and/or output functions that can then be used for control analysis and design.

A dynamic system may be characterized by one or more differential and/or difference equations. The one or more differential and/or difference equations may be represented by a graphical model in a modeling system. In order to simulate the dynamic system represented by the graphical model, the one or more differential and/or difference equations may need to be solved for particular time values. The graphical model may be executed to simulate the dynamic system that it represents. The graphical model may be simulated over a time interval and a response may be generated and plotted over the time interval.

The graphical model may include one or more blocks. In an exemplary embodiment, a block may be characterized by one the following equations.

For purely algebraic blocks:

$$y=g(u) \qquad \text{Equation (1)}$$

For continuous time blocks:

$$x'=f(x, u, t)$$

$$y=g(x,u,t) \qquad \text{Equation (2)}$$

For discrete time blocks:

$$x_{k+1}=f(x_k,u_k)$$

$$y_k=g(x_k,u_k) \qquad \text{Equation (3)}$$

In Equations (1), (2), and (3), x may represent the states of the block, u may represent inputs to the block, t may represent a time variable, and y may represent outputs of the block. In equation (3), $y_k=y(t_k)$, $x_k=x(t_k)$, and $u_k=u(t_k)$, k=1, ... where $t_k=kT$ is the kth hit time of a discrete sample time.

An example of a block that may be associated with a state may be an integrator block. An integrator block may convert a dx/dt signal (i.e., the derivative of x with respect to t) to an x signal. The function f, also called the derivative function, may characterize the rate of change with respect to time of the state variables of the block as a function of the states, inputs and time. The variables x, u, and y may be vectors. The function g, also called the output function, may characterize the outputs of the block as a function of the states, inputs, and time. While implementations described herein may be described as discrete functions and/or blocks, the implementations described herein may be applied to continuous functions and/or blocks, or to combinations of continuous and discrete functions and/or blocks. For a discrete block, the derivative function may be replaced by an update function and the time variable may be replaced by a time delay variable.

A block Jacobian matrix J for a block may be defined as follows:

$$J = \begin{bmatrix} \frac{\partial f}{\partial x} & \frac{\partial f}{\partial u} \\ \frac{\partial g}{\partial x} & \frac{\partial g}{\partial u} \end{bmatrix} = \begin{bmatrix} A & B \\ C & D \end{bmatrix} \qquad \text{Equation (4)}$$

Thus, in the block Jacobian matrix, sub-matrix A (the system matrix) may correspond to a matrix that defines the partial derivatives of the derivative function with respect to the states, sub-matrix B (the input matrix) may correspond to a matrix that defines the partial derivatives of the derivative function with respect to the inputs, sub-matrix C may correspond to a matrix that defines the partial derivatives of the output function with respect to the states, and sub-matrix D may correspond to a matrix that defines the partial derivatives of the output function with respect to the inputs.

For discrete-time blocks, the Jacobian for a given state $x_k$ and input $u_k$ is the discrete-time linear system:

$$\delta x_{k+1} = A\delta x_k + B\delta u_k \equiv \frac{\partial f}{\partial x}\bigg|_{x_k,u_k} \delta x_k + \frac{\partial f}{\partial u}\bigg|_{x_k,u_k} \delta u_k \quad \text{Equation (4)}$$

$$\delta y_k = C\delta x_k + D\delta u_k \equiv \frac{\partial g}{\partial x}\bigg|_{x_k,u_k} \delta x_k + \frac{\partial g}{\partial u}\bigg|_{x_k,u_k} \delta u_k$$

A graphical model may include multiple blocks. An open loop Jacobian matrix may be determined for a graphical model by the following process. Block Jacobian matrices may be determined for the blocks included in the graphical model. A block Jacobian matrix for a block may be defined by a user, may be determined analytically from one or more equations that are associated with the block, and/or may be determined numerically using a perturbation algorithm. The block Jacobian matrices associated with individual blocks of the graphical model may be concatenated into a single block Jacobian matrix.

FIG. 1 is a diagram of an exemplary environment 100 according to an implementation described herein. As shown in FIG. 1, environment 100 may include a computer device 110, a network 130, a target environment 140, and a processing cluster 150.

Computer device 110 may include one or more computer devices, such as a personal computer, a workstation, a server device, a blade server, a mainframe, a personal digital assistant (PDA), a laptop, a tablet, or another type of computation or communication device. Computer device 110 may include a modeling system 120. Modeling system 120 may include a development tool that enables creation, modification, design, and/or simulation of graphical models representing dynamic systems. Furthermore, modeling system 120 may enable the generation of executable code based on a graphical model. In implementations described herein, modeling system 120 may use code generation techniques to serve the use of control design and analysis.

Network 130 may enable computer device 110 to communicate with other components of environment 100, such as target environment 140 and/or processing cluster 150. Network 130 may include one or more wired and/or wireless networks. For example, network 130 may include a cellular network, the Public Land Mobile Network (PLMN), a second generation (2G) network, a third generation (3G) network, a fourth generation (4G) network (e.g., a long term evolution (LTE) network), a fifth generation (5G) network, a code division multiple access (CDMA) network, a global system for mobile communications (GSM) network, a general packet radio services (GPRS) network, a Wi-Fi network, an Ethernet network, a combination of the above networks, and/or another type of wireless network. Additionally, or alternatively, network 130 may include a local area network (LAN), a wide area network (WAN), a metropolitan area network (MAN), an ad hoc network, an intranet, the Internet, a fiber optic-based network (e.g., a fiber optic service network), a satellite network, a television network, and/or a combination of these or other types of networks.

Target environment 140 may include one or more devices that may be associated with a dynamic system that is represented by a graphical model in modeling system 120. For example, target environment 140 may include a set of sensors and/or a set of controllers corresponding to a dynamic system. Modeling system 120 may receive data from target environment 140 and use the received data as input to the graphical model. Furthermore, target environment 140 may receive executable code from modeling system 120. The received executable code may enable target environment 140 to perform one or more operations on the dynamic system associated with target environment 140. Target environment 140 may include, for example, an embedded processing device.

Processing cluster 150 may include processing resources which may be used by modeling system 120 in connection with a graphical model. For example, processing cluster 150 may include processing units 155-A to 155-N (referred to herein collectively as "processing units 155" and individually as "processing unit 155"). Processing units 155 may perform operations on behalf of computer device 110. For example, processing units 155 may perform parallel processing on a graphical model in modeling system 120. Modeling system 120 may provide an operation to be performed to processing cluster 150, processing cluster 150 may divide tasks associated with the operation among processing units 155, processing cluster 150 may receive results of the performed tasks from processing units 155, and may generate a result of the operation and provide the result of the operation to modeling system 120.

In one implementation, processing unit 155 may include a graphic processing unit (GPU). A GPU may include one or more devices that include specialized circuits for performing operations relating to graphics processing (e.g., block image transfer operations, simultaneous per-pixel operations, etc.) and/or for performing a large number of operations in parallel. In another example, processing unit 155 may include a field programmable gate array (FPGA). In yet another example, processing unit 155 may correspond to a core of a multi-core processor. In yet another example, processing unit 155 may include a computer device that is part of a cluster of computer devices.

Although FIG. 1 shows exemplary components of environment 100, in other implementations, environment 100 may include fewer components, different components, differently arranged components, and/or additional components than those depicted in FIG. 1. Alternatively, or additionally, one or more components of environment 100 may perform one or more tasks described as being performed by one or more other components of environment 100.

Figure 2:
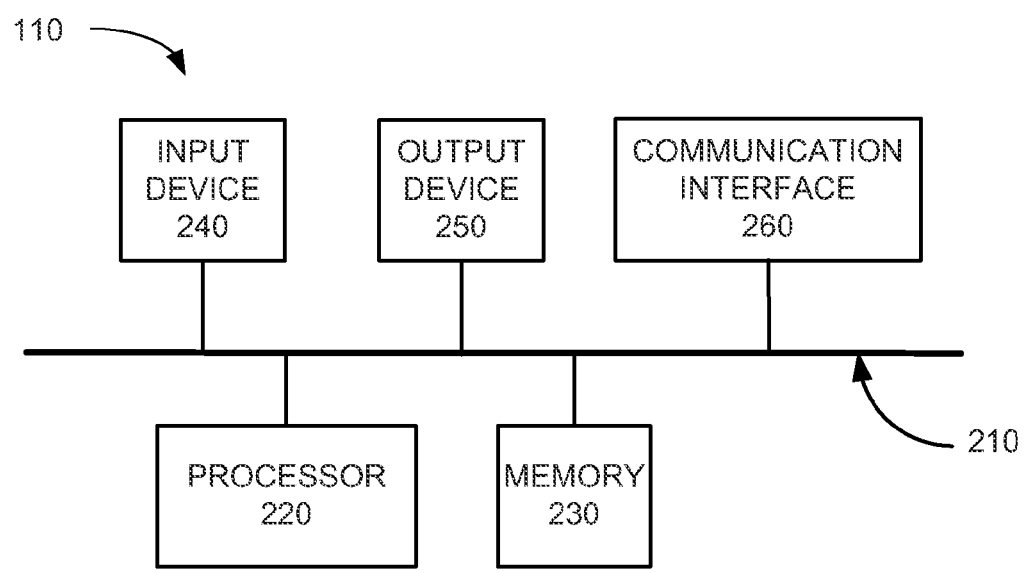
FIG. 2 is a diagram illustrating exemplary components of the computer device of FIG. 1.

FIG. 2 is a diagram illustrating exemplary components of computer device 110 according to a first implementation described herein. As shown in FIG. 2, computer device 110 may include a bus 210, a processor 220, a memory 230, an input device 240, an output device 250, and a communication interface 260.

Bus 210 may include a path that permits communication among the components of computer device 200. Processor 220 may include one or more single-core and/or or multi-core processors, microprocessors, and/or processing logic (e.g., application specific integrated circuits (ASICs), field programmable gate arrays (FPGAs), Advanced RISC Machines (ARM) processors, etc.) that may interpret and execute instructions. Memory 230 may include a random access memory (RAM) device or another type of dynamic storage device that may store information and instructions for execution by processor 220, a read only memory (ROM) device or another type of static storage device that may store static information and instructions for use by processor 220, a magnetic and/or optical recording memory device and its corresponding drive, and/or a removable form of memory, such as a flash memory.

Input device 240 may include a mechanism that permits an operator to input information to computer device 110, such as a keypad, a keyboard, a touch screen, a button, or an input jack for an input device such as a keypad or a keyboard, a camera, a microphone, an analog to digital (ADC) converter, a pulse-width modulation (PWM) input, etc. Output device 250 may include a mechanism that outputs information to the operator, including one or more light indicators, a display, a touch screen, a speaker, a digital to analog (DAC) converter, a PWM output, etc.

Communication interface 260 may include a transceiver that enables computer device 110 to communicate with other devices and/or systems. For example, communication interface 260 may include a modem, a network interface card, and/or a wireless interface card.

As will be described in detail below, computer device 110 may perform certain operations relating to parameter tuning. Computer device 110 may perform these operations in response to processor 220 executing software instructions stored in a computer-readable medium, such as memory 230. A computer-readable medium may be defined as a non-transitory memory device. A memory device may include memory space within a single physical memory device or spread across multiple physical memory devices.

The software instructions may be read into memory 230 from another computer-readable medium, or from another device via communication interface 260. The software instructions contained in memory 230 may cause processor 220 to perform processes that will be described later. Alternatively, hardwired circuitry may be used in place of or in combination with software instructions to implement processes described herein. Thus, implementations described herein are not limited to any specific combination of hardware circuitry and software.

Although FIG. 2 shows exemplary components of computer device 110, in other implementations, computer device 110 may include fewer components, different components, additional components, or differently arranged components than depicted in FIG. 2. Additionally or alternatively, one or more components of computer device 110 may perform one or more tasks described as being performed by one or more other components of computer device 200.

Figure 3:
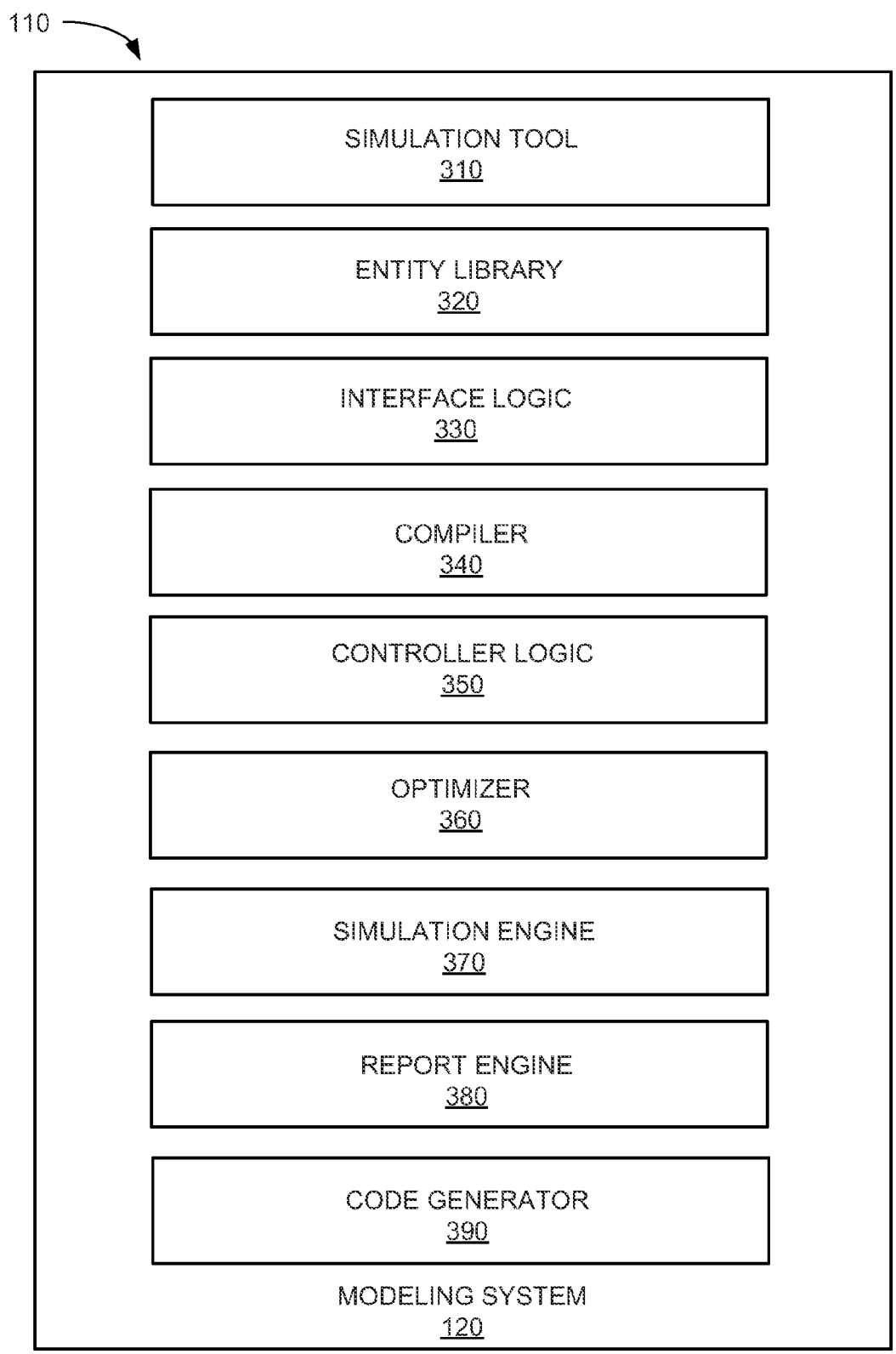
FIG. 3 is a diagram of exemplary components of a modeling system that may be included in the computer device of FIG. 1.

FIG. 3 is a diagram of exemplary components of modeling system 120 that may be included in computer device 110. Modeling system 120 may include a development tool that enables existing software components to be used in the creation of a model and that may enable generation of executable code based on the model. For example, the development tool may include a graphical modeling tool or application that provides a user interface for a numerical computing environment. Additionally, or alternatively, the development tool may include a graphical modeling tool and/or application that provides a user interface for modeling and executing a dynamic system (e.g., based on differential equations, difference equations, algebraic equations, discrete events, discrete states, stochastic relations, etc.).

A dynamic system (either natural or man-made) may be a system whose response at any given time may be a function of its input stimuli, its current state, and a current time. Such systems may range from simple to highly complex systems. Natural dynamic systems may include, for example, a falling body, the rotation of the earth, bio-mechanical systems (muscles, joints, etc.), bio-chemical systems (gene expression, protein pathways), weather, and climate pattern systems, and/or any other natural dynamic system. Man-made or engineered dynamic systems may include, for example, a bouncing ball, a spring with a mass tied on an end, automobiles, airplanes, control systems in major appliances, communication networks, audio signal processing systems, and a financial or stock market, and/or any other man-made or engineered dynamic system.

The system represented by a model may have various execution semantics that may be represented in the model as a collection of modeling entities, often referred to as blocks. A block may generally refer to a portion of functionality that may be used in the model. The block may be represented graphically, textually, and/or stored in some form of internal representation. Also, a particular visual depiction used to represent the block, for example in a graphical block diagram, may be a design choice.

A block may be hierarchical in that the block itself may comprise one or more blocks that make up the block. A block comprising one or more blocks (sub-blocks) may be referred to as a subsystem block. A subsystem block may be configured to represent a subsystem of the overall system represented by the model. A subsystem may be a masked subsystem that is configured to have a logical workspace that contains variables only readable and writeable by elements contained by the subsystem.

A graphical model (e.g., a functional model) may include entities with relationships between the entities, and the relationships and/or the entities may have attributes associated with them. The entities my include model elements such as blocks and/or ports. The relationships may include model elements such as lines (e.g., connector lines) and references. The attributes may include model elements such as value information and meta information for the model element associated with the attributes. A graphical model may be associated with configuration information. The configuration information may include information for the graphical model such as model execution information (e.g., numerical integration schemes, fundamental execution period, etc.), model diagnostic information (e.g., whether an algebraic loop should be considered an error or result in a warning), model optimization information (e.g., whether model elements should share memory during execution), model processing information (e.g., whether common functionality should be shared in code that is generated for a model), etc.

Additionally, or alternatively, a graphical model may have executable semantics and/or may be executable. An executable graphical model may be a time based block diagram. A time based block diagram may consist, for example, of blocks connected by lines (e.g., connector lines). The blocks may consist of elemental dynamic systems such as a differential equation system (e.g., to specify continuous-time behavior), a difference equation system (e.g., to specify discrete-time behavior), an algebraic equation system (e.g., to specify constraints), a state transition system (e.g., to specify finite state machine behavior), an event based system (e.g., to specify discrete event behavior), etc. The lines may represent signals (e.g., to specify input/output relations between blocks or to specify execution dependencies between blocks), variables (e.g., to specify information shared between blocks), physical connections (e.g., to specify electrical wires, pipes with volume flow, rigid mechanical connections, etc.), etc. The attributes may consist of meta information such as sample times, dimensions, complexity (whether there is an imaginary component to a value), data type, etc. associated with the model elements.

In a time based block diagram, ports may be associated with blocks. A relationship between two ports may be created by connecting a line (e.g., a connector line) between the two ports. Lines may also, or alternatively, be connected to other lines, for example by creating branch points. For instance, three or more ports can be connected by connecting a line to each of the ports, and by connecting each of the lines to a common branch point for all of the lines. A common branch point for the lines that represent physical connections may be a dynamic system (e.g., by summing all variables of a certain type to 0 or by equating all variables of a certain type). A port may be an input port, an output port, an enable port, a trigger port, a function-call port, a publish port, a subscribe port, an exception port, an error port, a physics port, an entity flow port, a data flow port, a control flow port, etc.

Relationships between blocks may be causal and/or non-causal. For example, a model (e.g., a functional model) may include a block that represents a continuous-time integration block that may be causally related to a data logging block by using a line (e.g., a connector line) to connect an output port of the continuous-time integration block to an input port of the data logging block. Further, during execution of the model, the value stored by the continuous-time integrator may change as the current time of the execution progresses. The value of the state of the continuous-time integrator may be available on the output port and the connection with the input port of the data logging block may make this value available to the data logging block.

In one example, a block may include or otherwise correspond to a non-causal modeling function or operation. An example of a non-causal modeling function may include a function, operation, or equation that may be executed in different fashions depending on one or more inputs, circumstances, and/or conditions. Put another way, a non-causal modeling function or operation may include a function, operation, or equation that does not have a predetermined causality. For instance, a non-causal modeling function may include an equation (e.g., $X=2Y$) that can be used to identify the value of one variable in the equation (e.g., "X") upon receiving an assigned value corresponding to the other variable (e.g., "Y"). Similarly, if the value of the other variable (e.g., "Y") were provided, the equation could also be used to determine the value of the one variable (e.g., "X").

Assigning causality to equations may consist of determining which variable in an equation is computed by using that equation. Assigning causality may be performed by sorting algorithms, such as a Gaussian elimination algorithm. The result of assigning causality may be a lower block triangular matrix that represents the sorted equations with strongly connected components representative of algebraic loops. Assigning causality may be part of model compilation.

Equations may be provided in symbolic form. A set of symbolic equations may be symbolically processed to, for example, produce a simpler form. To illustrate, a system of two equations $X=2Y+U$ and $Y=3X-2U$ may be symbolically processed into one equation $5Y=-U$. Symbolic processing of equations may be part of model compilation.

As such, a non-causal modeling function may not, for example, require a certain input or type of input (e.g., the value of a particular variable) in order to produce a valid output or otherwise operate as intended. Indeed, the operation of a non-causal modeling function may vary based on, for example, circumstance, conditions, or inputs corresponding to the non-causal modeling function. Consequently, while the description provided above generally describes a directionally consistent signal flow between blocks, in other implementations, the interactions between blocks may not necessarily be directionally specific or consistent.

In an embodiment, connector lines in a model may represent related variables that are shared between two connected blocks. The variables may be related such that their combination may represent power. For example, connector lines may represent physical conductors transmitting/carrying voltage, and current, power, etc. Additionally, or alternatively, the signal flow between blocks may be automatically derived.

In some implementations, one or more of blocks may also, or alternatively, operate in accordance with one or more rules or policies corresponding to a model in which they are included. For instance, if the model were intended to behave as an actual, physical system or device, such as an electronic circuit, the blocks may be required to operate within, for example, the laws of physics (also referred to herein as "physics-based rules"). These laws of physics may be formulated as differential and/or algebraic equations (e.g., constraints, etc.). The differential equations may include derivatives with respect to time, distance, and/or other quantities, and may be ordinary differential equations (ODEs), partial differential equations (PDEs), and/or differential and algebraic equations (DAEs). Requiring models and/or model components to operate in accordance with such rules or policies may, for example, help ensure that simulations based on such models will operate as intended.

A sample time may be associated with the elements of a graphical model. For example, a graphical model may include a block with a continuous sample time such as a continuous-time integration block that may integrate an input value as time of execution progresses. This integration may be specified by a differential equation. During execution, the continuous-time behavior may be approximated by a numerical integration scheme that is part of a numerical solver. The numerical solver may take discrete steps to advance the execution time, and these discrete steps may be constant during an execution (e.g., fixed step integration) or may be variable during an execution (e.g., variable-step integration).

Alternatively, or additionally, a graphical model may include a block with a discrete sample time such as a unit delay block that may output values of a corresponding input after a specific delay. This delay may be a time interval and this interval may determine a sample time of the block. During execution, the unit delay block may be evaluated each time the execution time has reached a point in time where an output of the unit delay block may change. These points in time may be statically determined based on a scheduling analysis of the graphical model before starting execution.

Alternatively, or additionally, a graphical model may include a block with an asynchronous sample time, such as a function-call generator block that may schedule a connected block to be evaluated at a non-periodic time. During execution, a function-call generator block may evaluate an input and when the input attains a specific value when the execution time has reached a point in time, the function-call generator block may schedule a connected block to be evaluated at this point in time and before advancing execution time.

Further, the values of attributes of a graphical model may be inferred from other elements of the graphical model or attributes of the graphical model. The inferring may be part of a model compilation. For example, the graphical model may include a block, such as a unit delay block, that may have an attribute that specifies a sample time of the block. When a graphical model has an execution attribute that specifies a fundamental execution period, the sample time of the unit delay block may be inferred from this fundamental execution period.

As another example, the graphical model may include two unit delay blocks where the output of the first of the two unit delay blocks is connected to the input of the second of the two unit delay block. The sample time of the first unit delay block may be inferred from the sample time of the second unit delay block. This inference may be performed by propagation of model element attributes such that after evaluating the sample time attribute of the second unit delay block, a graph search proceeds by evaluating the sample time attribute of the first unit delay block since it is directly connected to the second unit delay block.

The values of attributes of a graphical model may be set to characteristics settings, such as one or more inherited settings, one or more default settings, etc. For example, the data type of a variable that is associated with a block may be set to a default such as a double. Because of the default setting, an alternate data type (e.g., a single, an integer, a fixed point, etc.) may be inferred based on attributes of elements that the graphical model includes (e.g., the data type of a variable associated with a connected block) and/or attributes of the graphical model. As another example, the sample time of a block may be set to be inherited. In case of an inherited sample time, a specific sample time may be inferred based on attributes of elements that the graphical model includes and/or attributes of the graphical model (e.g., a fundamental execution period).

Modeling system 120 may implement a technical computing environment (TCE). A TCE may include hardware and/or software based logic that provides a computing environment that allows users to perform tasks related to disciplines, such as, but not limited to, mathematics, science, engineering, medicine, business, etc., more efficiently than if the tasks were performed in another type of computing environment, such as an environment that required the user to develop code in a conventional programming language, such as C++, C, Fortran, Java, etc.

In one implementation, the TCE may include a dynamically typed language that can be used to express problems and/or solutions in mathematical notations familiar to those of skill in the relevant arts. For example, the TCE may use an array as a basic element, where the array may not require dimensioning. In addition, the TCE may be adapted to perform matrix and/or vector formulations that can be used for data analysis, data visualization, application development, simulation, modeling, algorithm development, etc. These matrix and/or vector formulations may be used in many areas, such as statistics, image processing, signal processing, control design, life sciences modeling, discrete event analysis and/or design, state based analysis and/or design, etc.

The TCE may further provide mathematical functions and/or graphical tools (e.g., for creating plots, surfaces, images, volumetric representations, etc.). In one implementation, the TCE may provide these functions and/or tools using toolboxes (e.g., toolboxes for signal processing, image processing, data plotting, parallel processing, etc.). In another implementation, the TCE may provide these functions as block sets. In still another implementation, the TCE may provide these functions in another way, such as via a library, etc. The TCE may be implemented as a text based environment, a graphically based environment, or another type of environment, such as a hybrid environment that is both text and graphically based.

The TCE may be implemented using products such as, but not limited to, MATLAB® by The MathWorks, Inc.; Octave; Python; Comsol Script; MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; or Modelica® or Dymola from Dassault Systemes.

An alternative embodiment may implement a TCE in a graphically-based TCE using products such as, but not limited to, Simulink®, Stateflow®, SimEvents®, etc., by The MathWorks, Inc.; VisSim by Visual Solutions; LabView® by National Instruments; Dymola by Dassault Systemes; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhopsody or Tau from Telelogic; Ptolemy from the University of California at Berkeley; or aspects of a Unified Modeling Language (UML) or SysML environment.

A further alternative embodiment may be implemented in a language that is compatible with a product that includes a TCE, such as one or more of the above identified text-based or graphically-based TCEs. For example, MATLAB (a text-based TCE) may use a first command to represent an array of data and a second command to transpose the array. Another product, that may or may not include a TCE, may be MATLAB-compatible and may be able to use the array command, the array transpose command, or other MATLAB commands. For example, the other product may use the MATLAB commands to perform model checking.

Yet another alternative embodiment may be implemented in a hybrid TCE that combines features of a text-based and graphically-based TCE. In one implementation, one TCE may operate on top of the other TCE. For example, a text-based TCE (e.g., MATLAB) may operate as a foundation and a graphically-based TCE (e.g., Simulink) may operate on top of MATLAB and may take advantage of text-based features (e.g., commands) to provide a user with a graphical user interface and graphical outputs (e.g., graphical displays for data, dashboards, etc.).

As shown in FIG. 3, modeling system 120 may include a simulation tool 310, an entity library 320, an interface logic 330, a compiler 340, a controller logic 350, an optimizer 360, a simulation engine 370, a report engine 380, and a code generator 390.

Simulation tool 310 may include an application for building a model. Simulation tool 310 may be used to build a textual model or a graphical model having executable semantics. In the case of graphical models, simulation tool 310 may allow users to create, display, modify, diagnose, annotate, delete, print, etc., model entities and/or connections. Simulation tool 310 may interact with other entities illustrated in FIG. 1 for receiving user inputs, executing a model, displaying results, generating code, etc. Simulation tool 310 may provide a user with an editor for constructing or interacting with textual models and/or a GUI for creating or interacting with graphical models. The editor may be configured to allow a user to, for example, specify, edit, annotate, save, print, and/or publish a model. A textual interface may be provided to permit interaction with the editor. A user may write scripts that perform automatic editing operations on a model using the textual interface. For example, the textual interface may provide a set of windows that may act as a canvas for the model, and may permit user interaction with the model. A model may include one or more windows depending on whether the model is partitioned into multiple hierarchical levels.

Entity library 320 may include code modules or entities (e.g., blocks/icons) that a user can drag and drop into a display window that includes a graphical model. In the case of graphical models, a user may further couple entities using connections to produce a graphical model of a system, such as target environment 140.

Interface logic 330 may allow modeling system 120 to send or receive data and/or information to/from devices (e.g., target environment 140, processing cluster 150, etc.) or software modules (e.g., a function, an application program interface, etc.).

Compiler 340 may compile a model into an executable format. Compiled code produced by compiler 340 may be executed on computer device 110 to produce a modeling result. In an embodiment, compiler 340 may also provide debugging capabilities for diagnosing errors associated with the model. Complier 340 may generate executable code for a part of a graphical model. The executable code may then be automatically executed during execution of the model, so that a first part of the model executes as an interpreted execution and a second part of the model executes as a compiled execution.

Controller logic 350 may be used to create and implement controllers in a graphical model. For example, controller logic 350 may provide functionality for entities that represent types of controllers in the graphical model. When the graphical model executes, controller logic 350 may perform control operations on the model by interacting with entities in the graphical model. In an embodiment, controller logic 350 may include control algorithms that implement controllers in the graphical model, such as, for example, 'proportional-integral-derivative' (PID) controls, gain scheduling controls, H-infinity controls, model predictive controls (MPC), dynamic inversion controls, bang/bang controls, sliding mode controls, deadbeat controls, and/or other another type of controls. Embodiments of controller logic 350 may be configured to operate in standalone or distributed implementations.

Optimizer 360 may optimize code, parameters, performance (e.g., execution speed, memory usage), etc., for a model. For example, optimizer 360 may optimize code to cause the code to occupy less memory, to cause the code to execute more efficiently, to cause the code to execute faster, etc., than the code would execute if the code were not optimized. Optimizer 360 may also perform optimizations for controller logic 350, e.g., to optimize parameters for a controller. In an embodiment, optimizer 360 may operate with or may be integrated into compiler 340, controller logic 350, code generator 390, etc. Embodiments of optimizer 360 may be implemented via software objects that interact with other object oriented software, e.g., for receiving data on which optimizer 360 operates.

Simulation engine 370 may perform operations for executing a model to simulate a system. Executing a model to simulate a system may be referred to as simulating a model. Simulation engine 370 may be configured to perform standalone or remote simulations based on user preferences or system preferences.

Report engine 380 may produce a report based on information in modeling system 120. For example, report engine 380 may produce a report indicating whether a controller satisfies design specifications, a report indicating whether a controller operates in a stable manner, a report indicating whether a model compiles properly, etc. Embodiments of report engine 380 can produce reports in an electronic format for display on output device 250, in a hardcopy format, and/or a format adapted for storage in a storage device.

Code generator 390 can generate code from a model. In an embodiment, code generator 390 may be configured to compile and link the generated code to produce an "in-memory executable" version (also referred to as an "in-memory representation") of a model. The in-memory executable version of model may be used, for example, to simulate, verify, trim, and/or linearize the model. In an embodiment, code generator 390 may receive code in a first format and may transform the code from the first format into a second format. In an embodiment, code generator 390 can generate source code, assembly language code, binary code, interface information, configuration information, performance information, task information, etc., from at least a portion of a model. For example, code generator 390 can generate C, C++, SystemC, Java, Structured Text, etc., code from the model.

In implementations described herein, an in-memory executable may include an Abstract Syntax Tree (AST), a data flow graph (DFG), and/or a control flow graph (CFG). An AST may be a tree representation of the program source code. In practice, the AST can be a simplified tree structure representing a parsing result. The AST may be either generated by explicitly converting from a parse tree or constructed by walking the parse tree implicitly using the logics in a parser. The AST is closely coupled with the programming language. A DFG may be a directed graph representing the data flow of the program. Each node in the data flow may correspond to a basic block. A node may represent a single data assignment and/or transformation statement of the program. The edges of the nodes may correspond to the flow of data in the program, such as the variables and values they represent. For example, if a variable is computed in one statement and used in a computation of another statement, there is an edge between the nodes corresponding to the statements. A CFG may be a directed graph representing control flow of the program. Each node in the control flow may correspond to a basic block. A node may represent a single statement of the program. The edges of the nodes may correspond to the flow of control in the program, such as the natural flow from one line to the next and the jumps may correspond to conditional and loop statements. For example, if there is a statement y that follows statement x, there is an edge from x to y.

Embodiments of code generator 390 can further generate Unified Modeling Language (UML) based representations and/or extensions from some or all of a graphical model (e.g., System Modeling Language (SysML), Extensible Markup Language (XML), Modeling and Analysis of Real Time and Embedded Systems (MARTE), Architecture Analysis and Design Language (AADL), Hardware Description Language (HDL), Automotive Open System Architecture (AUTOSAR), etc.). In an embodiment, optimizer 360 can interact with code generator 390 to generate code that is optimized according to a parameter (e.g., memory use, execution speed, multi-processing, etc.). Embodiments of modeling environments consistent with principles of the invention can further include components such as verification components, validation components, etc.

Although FIG. 3 shows exemplary components of modeling system 120, in other implementations, modeling system 120 may include fewer components, different components, differently arranged components, or additional components than depicted in FIG. 3. Additionally or alternatively, one or more components of modeling system 120 may perform one or more tasks described as being performed by one or more other components of modeling system 120.

Figure 4:
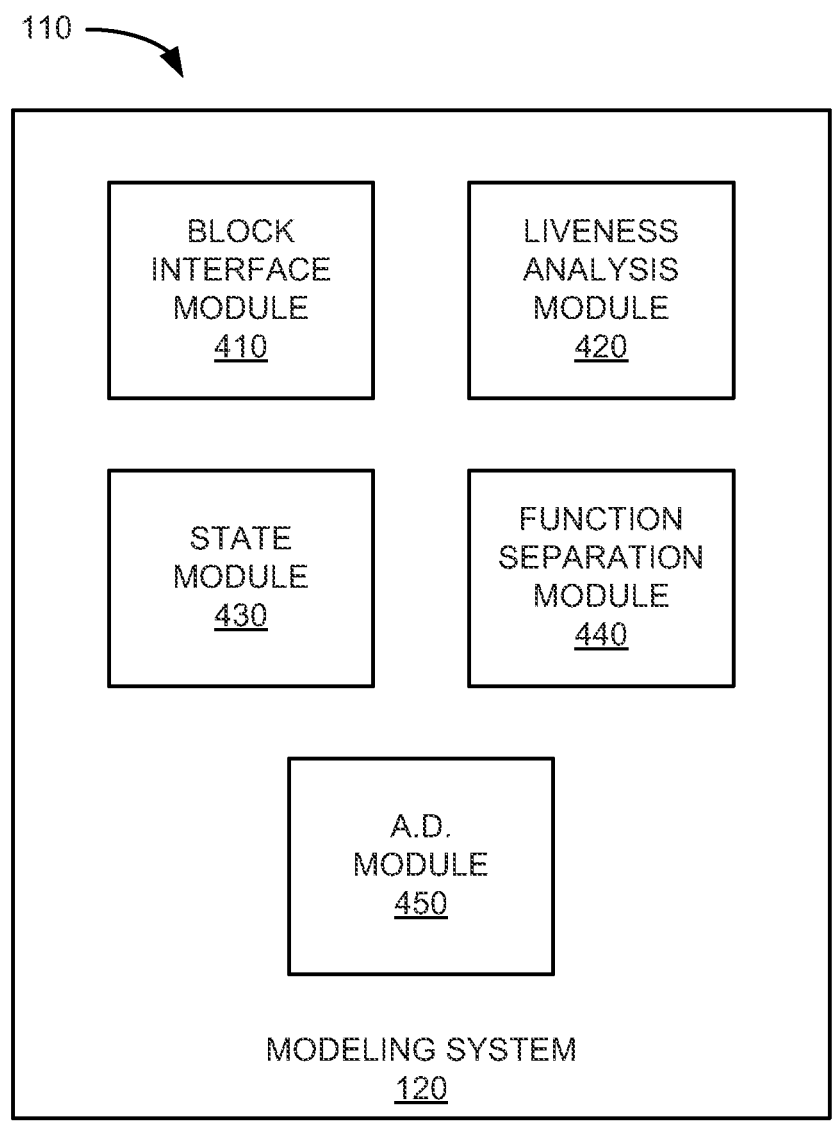
FIG. 4 is a diagram of exemplary functional components of the modeling system of FIG. 3.

FIG. 4 is a diagram of exemplary functional components of modeling system 120 that relate to code generation for control analysis and design. The functional components of modeling system 120 shown in FIG. 4 may be implemented, for example, as part of optimizer 360, simulation engine 370, code generator 390, and/or any of the other components of modeling system 120 described above in connection with FIG. 3. Furthermore, the functional components of modeling system 120 shown in FIG. 4 may be implemented by processor 220 and memory 230 of computer device 110. Additionally or alternatively, some or all of the functional components of modeling system 120 shown in FIG. 4 may be implemented by hard-wired circuitry. As shown in FIG. 4, modeling system 120 may include a block interface module 410, a liveness analysis module 420, a state module 430, a function separation module 440, and an algorithmic differentiation module 450.

A block typically implements a set of methods for executing certain tasks at certain steps. Some of the methods are related to the graphical editing environments, and some of the methods are implemented to facilitate the compilation of the block diagram. Runtime methods, as the term is used herein, are the methods that will be invoked when the block is executed (e.g., by simulation engine 370). A method may include, for example, any sequence of operations that are executed as a unit (e.g., function, procedure, method, subprogram, etc.). Implementations described herein primarily involve four runtime methods: output, update, step, and Jacobian. The output method refreshes (rewrites) the output variables of the block based on current values of its input variables and state variables. The update method rewrites the state variables based on the current values of its input variables (and maybe output variables). The step method is a combined method that implements output and update in one function. The Jacobian method is a method that does not vary its state or output and outputs the Jacobian matrices. In some implementations, another runtime method, derivatives, may also be used. The derivatives method may calculate and/or approximate derivative values of a state variable (x) in a continuous time block.

A discrete time block can either implement a step method or both an output and an update method. When a discrete time block is stateless, the two different implementations (e.g., step and output/update) are the same. Similarly, a continuous time block can either implement a step method or both an output and a derivatives method. When a continuous time block is stateless, the two different implementations (e.g., step and output/derivatives) are the same. For purposes of control analysis and design, blocks that implement step methods are undesirable. Instead, discrete time blocks with separate update and output methods (or separate derivative and output methods for continuous time blocks) are required, which may be referred to herein as the function separation requirement. For simplicity, descriptions herein generally refer to discrete time blocks, unless noted otherwise.

A block method may have access to variables. In implementations described herein, these variables can be limited to three different kinds of variables to simplify description: global variables, local variables, and persistent variables. Global variables are accessible in the runtime methods of all blocks. A global variable can be read-only or read-and-write. Local variables are only accessible to the block method. After the block method executes, the values in the local variables might be lost. Persistent variables are local variables whose values will be held until the next time that variable is accessed. The input variable of a typical block is treated as read-only global variable in the block runtime method. The output variable of a block is a read-and-write global variable. The scratch work vectors are local variables. State variables are persistent variables. Explicitly defined data stores are either read-only global variables or read-and-write global variables.

Functional components of FIG. 4 may be used to automatically convert blocks with step methods into separate output methods and update methods, generating source code of block methods that can be used in control analysis and design.

Block interface module 410 may provide a framework to detect blocks that have step methods instead of separate update and/or output methods. For example, block interface module 410 may determine whether a particular block within a graphical model in a modeling application includes one or more step methods. Block interface module 410 may, for example, store one or more function names (e.g., "step," "output-update," etc.) that can be matched to step functionality. In one implementation, block interface module 410 may scan source code for the block to determine if a particular step method label (e.g., that matches a stored step method name, a stored step method comment, etc.) is called. If it is determined that the particular block does not include a step method, block interface module 410 may select another block from the graphical model until a block with a step method is identified. If it is determined that the particular block includes a step method, block interface module 410 may request and/or perform initial processing to obtain an in-memory representation of computer code from the block step method. The in-memory representation may include, for example, a CFG. In another implementation, block interface module 410 may identify multiple step methods within a single block.

Liveness analysis module 420 may perform a liveness analysis of a particular block step method based on the in-memory representation obtained by block interface module 410. A variable can be called "live" if it holds a value that may be needed in the future. More particularly, liveness analysis module 420 may identify live variables for the block step method that can then be used to determine if the block has state variables.

Figure 5:
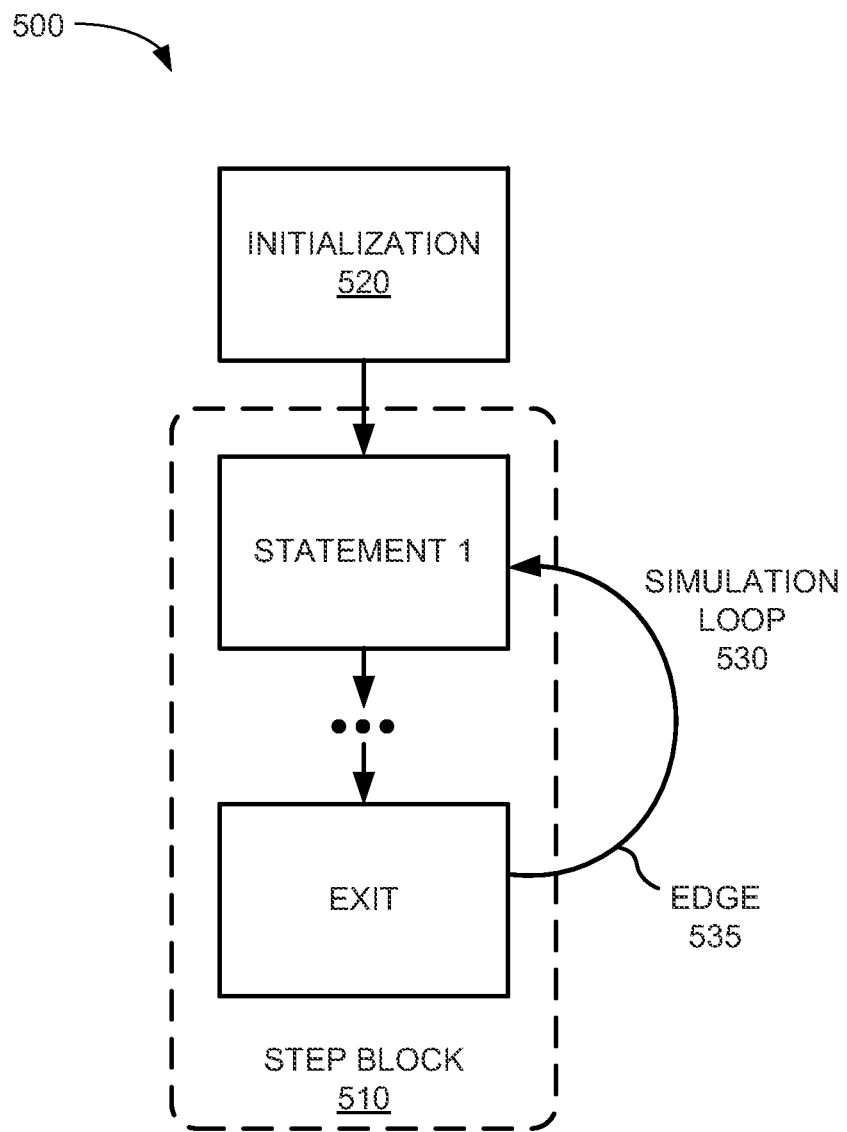
FIG. 5 is a diagram of an abstraction of a modified control flow graph, according to an implementation described herein.

FIG. 5 shows a modified CFG 500 as an abstraction of a CFG for an overall simulation for a step method block. Liveness analysis module 420 may use modified CFG 500 to perform a liveness analysis. As shown, modified CFG 500 may include an original step block 510 with an initialization block 520 and a simulation loop 530. Step block 510 may include one or more statements (e.g., "statement 1") leading to an exit block. Initialization block 520 is added to capture the actions that initialize the variables, such as initialization of the persistent and global variables and other block runtime methods. An edge 535 from the exit node to the entry node of the step method is also added to form simulation loop 530. Edge 535 is used to model the flow of control in the main simulation loop to return to the top when the next time step method 510 is called.

To analyze a block for liveness, liveness analysis module 420 may employ some basic designations. The equation $G=(V, E)$ can be used to represent a control flow graph, where G is the graph, V is the set of nodes, and E the set of edges. The successor of a node v is denoted as $succ(v)$. The predecessor of a node v is denoted as $pre(v)$. A dataflow value in the liveness analysis is a subset of the variables in the step method. Each node in the CFG may have several associated constraints: use, def, in (live-in) and out (live-out), where use[v] is the set of variables used in the corresponding statement; def[v] is the set of variables defined in the corresponding statement; in[v] is the set of variables that are live in any of the incoming edges of v; out[v] is the set of variables that are live in any of the out-going edges of v. The use and def sets can be computed by examining the statement for each node. The in and out sets are solved by computing the least fixed points (lfp) of the following dataflow equations:

$$in[n]=use[n]\cup(out[n]\backslash def[n])$$

$$out[n]=\cup_{s\in succ(n)}in[s] \quad \text{Equation (5)}$$

and the backslash (\) denotes the set difference: S1\S2={s|s∈ S1 and s ∉ S2}.

State module 430 may determine if a particular block step method has state, based on the results from liveness analysis module 420. Generally, in dynamical systems, a time-varying variable is a state variable if the variable's future value cannot be reconstructed from the current values of other variables. For step methods described herein, a persistent variable is a state variable if it is live (e.g., holds a value definition) on the newly added edge (e.g., edge 535) from an exit to an entry point. Thus, state module 430 may identify a persistent variable as a state variable if and only if it is live-in at the entry point and live-out at the exit point in modified CFG 500.

Figure 6:
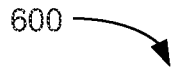
FIG. 6 is an example of an algorithm to compute a set of states of a step function using liveness analysis, according to an implementation described herein.

FIG. 6 provides an example of an algorithm 600 to compute the set of states of a step method using liveness analysis (e.g., as implemented via liveness analysis module 420 and state module 430). Using algorithm 600, liveness analysis module 420 first constructs a modified CFG of the method and then solves the dataflow equations for the persistent variables. State module 430 may identify the resulting live variables (from the set of persistent variables) as the states of the method.

Returning to FIG. 4, function separation module 440 may generate a block output method and/or a block update method based on the above identification of state variables by state module 430. If modified CFG 500 does not employ any state variables, function separation module 440 may generate only a block output method. If modified CFG 500 does employ a state variable, function separation module 440 may generate both a block output method and a block update method. Function separation module 440 may manipulate the AST of the original step method to satisfy the function separation requirement. Thus, function separation module 440 may ensure the output method does not modify state variables of the original step method. Similarly, function separation module 440 may ensure the update method does not modify the output variables.

To generate the separate output and update methods, function separation module 440 may create local copies of the persistent variables in the original step method. These variables may be initialized at the beginning of the methods to the same values as the persistent variables. For the body of the step method (step block 510), function separation module 440 may walk through the AST and rename the variables to use the local copy, instead of the persistent variables.

In some implementations, function separation module 440 may also remove unused definitions of variables. For example, definitions (defs) without corresponding use may be removed in instances where the variable defined in the statement is not live in any of the out-going edges. For example, after the function bodies of the methods are generated, function separation module 440 may run another pass of dataflow analysis to remove the unused code sections for the temporary variables. This additional pass may ensure that unnecessary code related to the temporary variables is removed from the final generated functions.

In another implementation, function separation module 440 may store properties associated with known functions (or runtime methods), such as an update method, an output method, and a derivative method. As described below, for example, in connection with FIG. 12, function separation module 440 may verify that labeled functions in a block method are consistent with the actual calculated results. In one implementation, function separation module 440 may compare the calculated variables from the dataflow equations with known properties for a particular function label and flag inconsistencies.

Algorithmic differentiation module 450 may generate an algorithmic differentiation of the code produced by function separation module 440. For example, algorithmic differentiation module 450 may generate algorithmic differentiation of only the output method (if there are no state variables in the block) or both the output method and the updated method (if the block has state variables). For each method, algorithmic differentiation module 450 may generate a set of functions that evaluates the partial derivative of that function with respect to each input variable and each state variable. Similar to the process described above for function separation module 440, algorithmic differentiation module 450 may use local variables to hold copies of the persistent and global variables. The rewriting of the source code may be implemented as a traverse of the AST. The control structure of the derivative functions are the same as in an assignment statement, and an extra statement involving the computation of the derivative is added. The function also adds initialization of the partial derivatives of the input and state variables. Algorithmic differentiation module 450 may also use another pass of data flow analysis to eliminate unused code from the local variables that were introduced.

Although FIG. 4 shows exemplary functional components of modeling system 120, in other implementations, modeling system 120 may include fewer functional components, different functional components, differently-arranged functional components, or additional functional components than depicted in FIG. 4. Additionally or alternatively, one or more components of modeling system 120 may perform one or more tasks described as being performed by one or more other components of modeling system 120.

Figure 7:
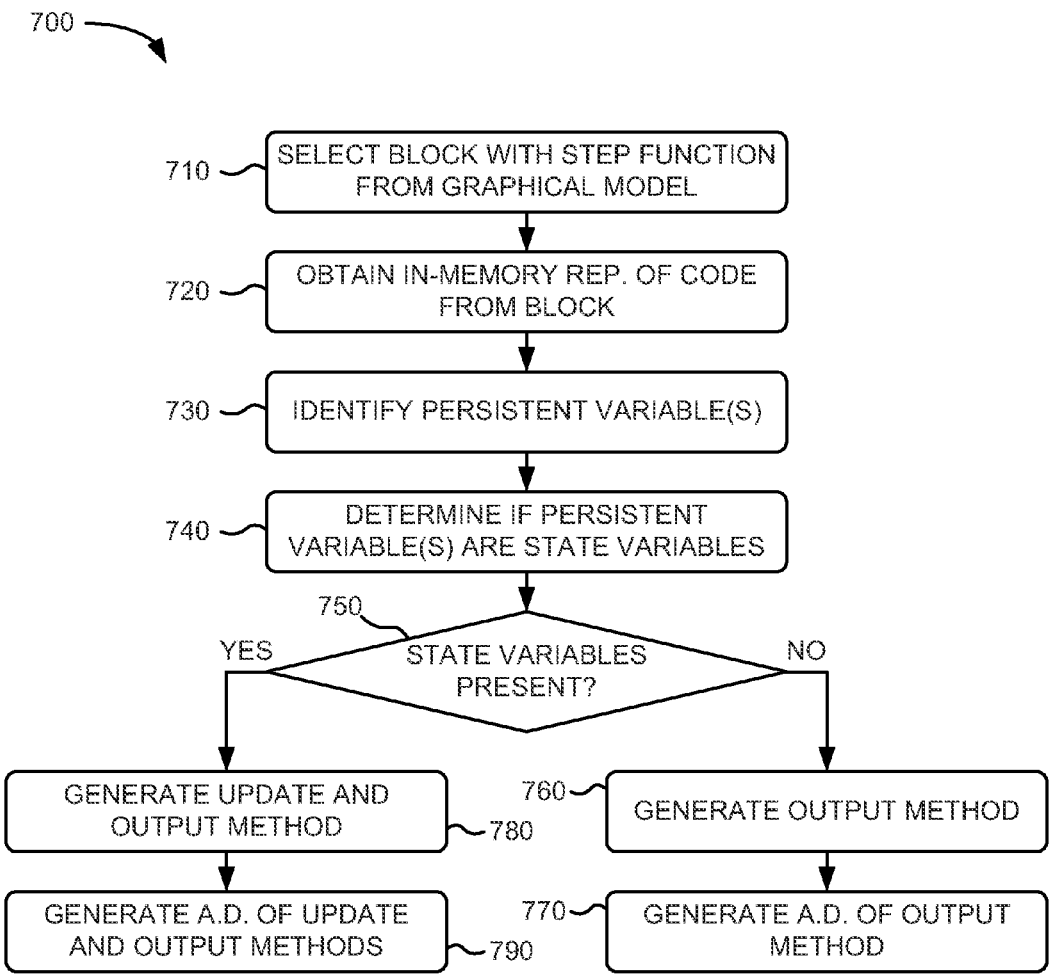
FIG. 7 is a flow diagram of an exemplary process for automatically generating code meeting a function separation requirement from block methods with step functions, according to an implementation described herein.

FIG. 7 is a flow diagram of an exemplary process 700 for automatically generating code for block methods with step methods to enable use in control analysis and design according to an implementation described herein. Process 700 describes a process for separating out a block output method and a state update method using code generation technology. In one implementation, process 700 may be performed by computer device 110. In other implementations, some or all of process 700 may be performed by another device or a group of devices separate from computer device 110 and/or including computer device 110.

Process 700 may include selecting a block with a step method from a graphical model (block 710). For example, block interface module 410 may analyze the blocks included in a graphical model and may select a particular block, including a step method, from the graphical model. FIG. 8 shows sample code 800 (e.g., MATLAB code) for a step method that may be selected by block interface module 410.

An in-memory representation of code from the block may be obtained (block 720). For example, liveness analysis module 420 may use as input an AST representation of the step method of the selected block. The AST may include one or more variables.

Persistent variables in the in-memory representation may be identified (block 730). For example, liveness analysis module 420 may identify, from the variables in the AST, a subset of persistent variables (e.g., local variables whose value will be held until the next time those variables are accessed). In one implementation, liveness analysis module 420 may generate a modified CFG to identify the persistent variables. The modified CFG may add an initialization block and a simulation loop to the original CFG.

It may be determined if the persistent variables are state variables (block 740). For example, state module 430 may solve dataflow equations for the persistent variables to determine the state variables. A persistent variable in a step method may be considered a state variable if the persistent variable is live-in at the entry point and live-out at the exit point in the modified CFG.

If state variables are not present in the modified CFG (block 750-NO), then an output method may be generated (block 760) and algorithmic differentiation may be performed (block 770). For example, function separation module 440 may generate a single block output method. In one implementation, function separation module 440 may create local copies of the persistent variables in the original step method. These variables may be initialized at the beginning of the methods to the same values as the persistent variables. For the body of the step method, function separation module 440 may walk through the AST and rename the variables to use the local copy, instead of the persistent variables. Algorithmic differentiation module 450 may then generate a set of functions that evaluates the partial derivative of the block output method with respect to each input variable.

If state variables are present in the modified CFG (block 750-YES), then both an output method and an update method may be generated (block 780) and algorithmic differentiation performed (block 790). For example, function separation module 440 may generate a block output method (e.g., that modifies the output variables, but not the state variables) and a block update method (e.g., that modifies the state variables, but not the output variables). In one implementation, function separation module 440 may create local copies of the persistent variables in the original step method. These variables may be initialized at the beginning of the methods to the same values as the persistent variables. For example, FIG. 9 shows an example of automatically generated code 900 (e.g., MATLAB code) for the output method derived from step method 800 of FIG. 8, and FIG. 10 shows an example of automatically generated code 1000 (e.g., MATLAB code) for the update method derived from step method 800. Using state variable x of step method 800, a local copy of x, named xt, may be used in the code samples of FIG. 9. In other instances, a local copy of y, named yt, may also be used. For the body of the step method, function separation module 440 may walk through the AST and rename the variables to use the local copy, instead of the persistent variables.

Process 700 may further include generating algorithmic differentiation of the update and output methods (block 790). For example, algorithmic differentiation module 450 may generate a set of functions that evaluate the partial derivative of the block output method and the block update method with respect to each input variable. FIG. 11 shows auto-generated code (e.g., MATLAB code) for the derivatives of the output method of FIG. 9. Another block method (e.g., a Jacobian method) may invoke the derivatives of FIG. 11 to compute elements for Jacobian matrices.

The resulting Jacobian matrices may be used in a variety of applications. For example, a bidomain simulator may employ a Jacobian matrix to provide simulation results for the graphical model in both a time domain and a frequency domain. The bidomain simulator may enable a user to monitor both a time domain response and a frequency domain response for a dynamic system, or a part of a dynamic system, represented by a graphical model during a simulation of the graphical model. As another example, stiffness of a graphical model may be determined based on a Jacobian matrix. Calculated stiffness may be used, for example, to determine if a particular type of automatic solver (e.g., an explicit solver or an implicit solver) is appropriate for a given dynamic system. In still another example, a Jacobian matrix may be used for parameter tuning. A parameter tuning module may receive a selection of one or more target output points in relation to a response generated for a graphical model during a simulation, receive a selection of one or more parameters to tune, determining an inverse parameter Jacobian matrix based on a parameter Jacobian matrix associated with the graphical model, and determine one or more adjustments to the selected one or more parameters to tune based on the selected one or more target output points and based on the determined inverse parameter Jacobian matrix. In a further example, a resulting Jacobian matrix may be used to determine what portions of a block diagram model an output is dependent on and visually indicate these dependencies to a user.

Figure 12:
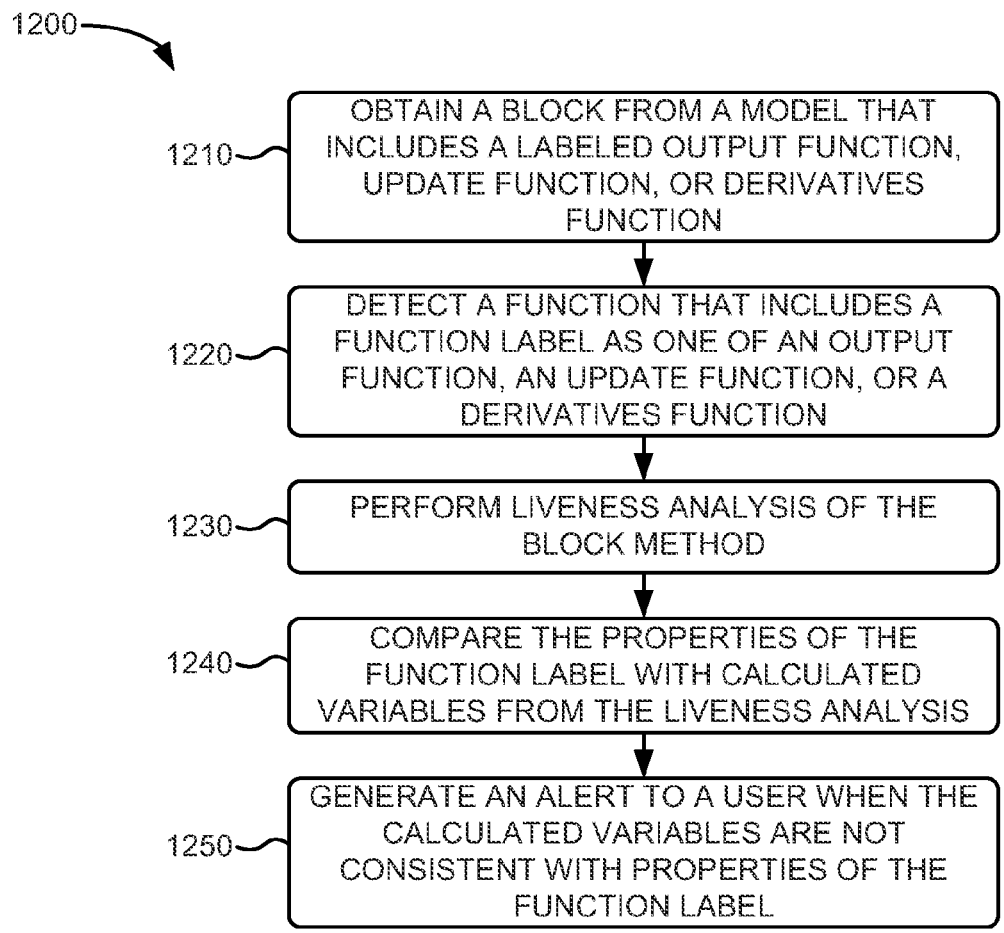
FIG. 12 is a flow diagram of an exemplary process for verifying the functionality of a labeled function, according to an implementation described herein.

FIG. 12 is a flow diagram of an exemplary process 1200 for verifying the functionality of a labeled method according to an implementation described herein. For example, process 1200 may apply liveness analysis techniques to verify whether a labeled output method, update method, or derivatives method are functionally consistent with a method label in a discrete time block or a continuous time block. In one implementation, process 1200 may be performed by computer device 110. In other implementations, some or all of process 1200 may be performed by another device or a group of devices separate from computer device 110 and/or including computer device 110.

Process 1200 may include obtaining a block from a model that includes a labeled output method, update method, or derivatives method (block 1210). For example, block interface module 410 may analyze the blocks included in a graphical model and may select a particular block, including one of an output method, an update method, or a derivatives method, from the graphical model.

Process 1200 may include detecting a method that includes a method label as one of an output method, an update method, or a derivatives method (block 1220). For example, block interface module 410 may, for example, store one or more method names (e.g., "derivatives," "output," "update," etc.) that can be matched to particular functionality. In one implementation, block interface module 410 may scan source code for the block to determine if a step method label is present.

Process 1200 may include performing liveness analysis of the of the block method (block 1230). For example, in one implementation, liveness analysis module 420 and/or state module 430 may perform a formal analysis to see if there are live variables after execution of the method terminates.

Process 1200 may include comparing the properties of the method label with calculated variables from the liveness analysis (block 1240). For example, each of the derivatives method, the output method, and the update method may include known properties. The derivatives method modifies only the state derivative value (e.g., in equation (2) above, only the variable x' changes in subsequent iterations of the derivatives method). Similarly, the output method changes only output (e.g., in equation (3) above y, but not x, changes), and the update method changes only the state (e.g., in equation (3) above x, but not y, changes. In one implementation, function separation module 440 (or another component) may compare the calculated subset of persistent variables from the dataflow equations with known properties for the particular method label.

Process 1200 may further include generating an alert to a user when the calculated variables are not consistent with properties of the method label (block 1250). For example, function separation module 440 (or another component) may determine that the subset of persistent variables is not consistent with the known properties of a labeled method and may generate a notice (e.g., in a report, or as an on-screen alert message, etc.) of the inconsistency. A notice may be generated, for example, when the method label includes the derivatives method and the calculated subset of persistent variables shows changes to an output variable.

Implementations described herein may use code generation techniques to serve the use of control design and analysis. Rather than generating optimized code for executing on a specific target, code can be generated to satisfy functional requirements, as needed by control design tools.

The foregoing description provides illustration and description, but is not intended to be exhaustive or to limit the implementations to the precise form disclosed. Modifications and variations are possible in light of the above teachings or may be acquired from practice of the described implementations.

For example, in some cases superfluous code may be eliminated to make the code compact. In the generated derivative functions, there may be places where expressions such as 0•a or a•b, where b is 0, are calculated. Expressions such as this can be simplified by employing constant propagation, abstract interpretation, and/or AST rewrite algorithms. With optimization algorithms, the generated source code can be further optimized. In another implementation, the algorithmic differentiation code can be further optimized by alternating the execution order of the derivative code.

In another implementation, systems and/or methods described herein may also apply to event iteration (e.g., in contrast or combination with difference and differential equations). In particular, in an event iteration a model may include variables that are updated at certain stages in the execution (e.g., discrete event state variables). Such state variables may be specified by a time variable or time independent delay (e.g., using the "Memory block" in Simulink® or the 'pre' operator in Modelica®).

Also, in another implementation, a 'block' may refer to a system with dynamic behavior (e.g., as a series of ordered values) and may refer to a textual description such as of a 'Model' in, for example, Modelica®. The textual description may contain instructions to connect blocks such as 'connect' in, for example, Modelica®. The connections may be based on ports that may have causal and non-causal semantics.

In another implementation, liveness analysis (e.g., as performed by liveness analysis module 420) may apply equally to imperative code (that may, e.g., include assignments) such as MATLAB, C, FORTRAN, etc., in which the order of evaluation is important and to declarative code (that may, e.g., include equations) such as Modelica® equations, Simscape equations, etc. in which the order of evaluation does not affect the values of the variables in the system of equations.

In other implementations, methods described herein may be applied to a system of multiple blocks or sub-blocks. For example, methods may include generating a system Jacobian method, after separating a system step method to system output and update methods, where (1) the system is defined as a set of interconnected blocks and their interconnections, and (2) the system step method is an aggregation of block step methods, based on the sorted order of the blocks. In other words, the step method could contain information of the block methods and their interconnections. In another embodiment, all the block output methods may be aggregated and, based on the sorted order, a system output method may be created (and then the same done for the update methods). The system may be any hierarchical level in the model hierarchy or it may cover the entire model. For example, for MATLAB's Embedded Real-Time (ERT) target code generation, the generated code of an entire model may contain a step method, which is an aggregation of block output and update methods. Liveness analysis can be applied to this step method and separate the step method to model output ("mdlOutput") and model update ("mdlUpdate") methods. Automatic differentiation can then be applied to the mdlOutput and mdlUpdate method, so as to obtain the system Jacobian method.

In still another implementation, systems and/or methods described herein may be used to analyze a functional mock-up unit (FMU) to automatically separate out the output, update, and derivative code of the FMU. For example, a co-simulation component may be developed based on a standardized interface (e.g., a functional mock-up interface, or FMI). The functional components of modeling system 120 may analyze the co-simulation component and automatically reorganize the code into separate output, update, and/or derivative calls of the FMI. In a similar implementation, systems and/or methods described herein may be used with the Dynamic System Block (DSblock) model interface standard, which may be utilized for simulating models in Modelica® or other modeling languages. Similar to FMI compatible components, the functional components of modeling system 120 may analyze a DSblock component and reorganize the code according to the output, update, and/or derivative separation.

Additionally, while series of blocks have been described with respect to FIGS. 7 and 12, the order of the blocks may be modified in other implementations. Further, non-dependent blocks may be performed in parallel.

Furthermore, while exemplary processes and/or examples may have been described with respect to a single response plot or a single output for illustrative purposes, the systems and methods described herein may be used with multiple outputs or response plots.

Also, certain portions of the implementations may have been described as a "component," "logic," "generator," "module," and/or "system" that performs one or more functions. The described "component," "logic," "generator," "module," and/or "system" may include hardware, such as a processor, an ASIC, or a FPGA, or a combination of hardware and software (e.g., software running on a processor).

It will be apparent that aspects, as described above, may be implemented in many different forms of software, firmware, and hardware in the implementations illustrated in the figures. The actual software code or specialized control hardware used to implement these aspects should not be construed as limiting. Thus, the operation and behavior of the aspects were described without reference to the specific software code—it being understood that software and control hardware could be designed to implement the aspects based on the description herein.

Even though particular combinations of features are recited in the claims and/or disclosed in the specification, these combinations are not intended to limit the disclosure of the implementations. Although each dependent claim listed below may directly depend on only one other claim, the disclosure of the implementations includes each dependent claim in combination with every other claim in the claim set.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on," as used herein is intended to mean "based, at least in part, on" unless explicitly stated otherwise.

What is claimed is:

1. A method, performed by a computer device, the method comprising:
   obtaining an in-memory representation of computer code from a block step method of an executable model, wherein the in-memory representation includes one or more variables and wherein the obtaining is performed by the computer device;
   identifying, from the one or more variables, a subset of persistent variables, wherein the identifying is performed by the computer device;
   determining if any of the one or more variables in the subset of persistent variables are state variables, wherein the determining is performed by the computer device;
   generating, by the computer device and based on the in-memory representation and the one or more variables:
      a block output method, when none of the subset of persistent variables are state variables, or
      the block output method and a block update method, when the subset of persistent variables includes a state variable.

2. The method of claim 1, further comprising:
   generating, based on the block output method and the block update method, source code for the block output method and the block update method of the executable model in a modeling application.

3. The method of claim 1, wherein the one or more variables include an input variable, an output variable, and the state variable.

4. The method of claim 3, wherein the block output method is configured to refresh the output variable based on a current value of the input variable and the state variable, and wherein the block update method is configured to rewrite the state variable based on the current value of the input variable.

5. The method of claim 3, wherein the in-memory representation includes an Abstract Syntax Tree (AST) representation of the block step method, wherein the block step method is configured to rewrite the state variable based on a current value of the input variable and to rewrite the output variable based on the current value of the input variable and the state variable.

6. The method of claim 1, wherein determining if any of the one or more variables in the subset of persistent variables are state variables includes:
   constructing a the in-memory representation as a control flow graph (CFG);
   identifying all persistent variables, of the one or more variables in the in-memory representation; and
   solving dataflow equations from the CFG for all the persistent variables.

7. The method of claim 6, wherein the subset of persistent variables includes one or more variables that hold a value definition at an entry point of the CFG and at an exit point of the CFG.

8. The method of claim 1, wherein the generating the block output method includes removing unused definitions of variables from one or more functions in the block output method, and wherein the generating the block output method and the block update method includes removing unused definitions of variables from one or more functions in the block output method and the block update method.

9. The method of claim 1, further comprising:
   generating an analytic Jacobian method for the block output method and the block update method when the subset of persistent variables includes a state variable.

10. The method of claim 1, further comprising:
    generating an analytic Jacobian method for the block output method, when the subset of persistent variables is empty.

11. The method of claim 9, further comprising:
    generating, based on the block output method with a first set of analytic Jacobian functions, source code for the block output method of the executable model.

12. The method of claim 11, wherein generating the first set of analytic Jacobian functions further comprises:
    generating an algorithmic differentiation of the block output method with respect to a state variable and an input variable from the one or more variables, and
    generating an algorithmic differentiation of the block update method with respect to a state variable and an input variable from the one or more variables.

13. The method of claim 1, wherein the in-memory representation includes a sub-block step method, and wherein the method further comprises:
    generating a sub-block output method, when none of the subset of persistent variables in a sub-block are state variables, or
    generating the sub-block output method and a sub-block update method, when the subset of persistent variables in the sub-block includes a state variable.

14. A non-transitory computer-readable medium containing one or more instructions executable by at least one processor, the non-transitory computer-readable medium comprising:
    one or more instructions to obtain an in-memory representation of computer code from a block step method of an executable graphical model, wherein the block step method includes a function with one or more variables including an input variable, an output variable, or a state variable;
    one or more instructions to identify whether the function from the block step method employs the state variable;
    one or more instructions to generate a block output method, based on the in-memory representation and using the one or more variables, when the function does not employ the state variable; and
    one or more instructions to generate both the block output method and a block update method, based on the in-memory representation and using the one or more variables, when the function employs the state variable.

15. The non-transitory computer-readable medium of claim 14, wherein source code is generated for the block output method and the block update method of the executable graphical model.

16. The non-transitory computer-readable medium of claim 14, wherein the in-memory representation includes an Abstract Syntax Tree (AST) representation of the block step method, wherein the block step method is configured to rewrite the state variable based on a current value of the input variable and to rewrite the output variable based on the current value of the input variable and a current value of the state variable.

17. The non-transitory computer-readable medium of claim 16, wherein the block output method is configured to rewrite the output variable based on the current value of the input variable and the cirent value of the state variable, and wherein the block update method is configured to rewrite the state variable based on the current value of the input variable.

18. The non-transitory computer-readable medium of claim 14, wherein the one or more instructions to identify if the function from the block step method employs the state variable includes:

constructing the in-memory representation as a control flow graph (CFG) of the block step method;
identifying all persistent variables, of the one or more variables in the in-memory representation; and
solving dataflow equations from the CFG for all the persistent variables to detect state variables that are live-in at an entry point of the CFG and live-out at an exit point of the CFG.

19. The non-transitory computer-readable medium of claim 14, further comprising one or more instructions to:
remove, from the block output method and the block update method, unused definitions of any of the one or more variables.

20. The non-transitory computer-readable medium of claim 14, further comprising one or more instructions to:
generate a first set of analytic Jacobian functions for the block output method and the block update method when the function employs the state variable.

21. The non-transitory computer-readable medium of claim 20, wherein generating the first set of analytic Jacobian functions further comprises:
generating an algorithmic differentiation of the block output method with respect to the state variable and the input variable from the one or more variables, and
generating an algorithmic differentiation of the block update method with respect to the state variable and the input variable from the one or more variables.

22. A computing device comprising:
a memory to store executable instructions to implement an executable graphical model of a dynamic system, wherein the executable graphical model includes one or more input and output points; and
a processor configured to:
obtain an in-memory representation of computer code from a block step method of the executable graphical model, wherein the block step method includes a function with one or more variables including an input variable, an output variable, or a state variable;
identify if the function from the block step method employs the state variable;
generate a first block output method, based on the in-memory representation and using the one or more variables, when the function does not employ the state variable; and
generate both a second block output method and a block update method, based on the in-memory representation and using the one or more variables, when the function employs the state variable.

23. The computing device of claim 22, wherein source code is generated for the block output method and the block update method of the executable graphical model.

24. The computing device of claim 22, wherein the processor is further configured to:
generate a first set of analytic Jacobian functions for the first block output method when the function does not employ the state variable; and
generate a second set of analytic Jacobian functions for the second block output method and the block update method when the function does employs the state variable.

25. The computing device of claim 24, wherein generating the first set of analytic Jacobian functions further comprises:
generating an algorithmic differentiation of the second block output method with respect to the state variable and the input variable from the one or more variables, and
generating an algorithmic differentiation of the block update method with respect to the state variable and the input variable from the one or more variables.

26. The computing device of claim 22, wherein the second block output method is configured to rewrite the output variable based on a current value of the input variable and the state variable, and wherein the block update method is configured to rewrite the state variable based on the current value of the input variable.

27. A method, comprising:
obtaining computer code from a block method of an executable model, wherein the computer code includes one or more variables and wherein the obtaining is performed by a computer device;
detecting, from the computer code, a method that includes a function label as one of an output method, an update method, or a derivatives method, wherein the detecting is performed by the computer device;
performing liveness analysis of the block method, wherein the analysis is performed by the computer device;
comparing properties of the function label with calculated variables from the liveness analysis, wherein the comparing is performed by the computer device; and
generating, based on the comparing, an alert to a user whether the calculated variables are consistent with properties of the function label.

28. The method of claim 27, wherein the function label includes the derivatives method and the properties of the function label include only state variable derivatives in a subset of persistent variables.

29. The method of claim 27, wherein the function label includes the update method and the properties of the function label include only state variables in a subset of persistent variables.

30. The method of claim 27, wherein the function label includes the output method and the properties of the function label include no state variables in a subset of persistent variables.

* * * * *